(12) United States Patent
Somada et al.

(10) Patent No.: US 11,039,534 B2
(45) Date of Patent: Jun. 15, 2021

(54) ELECTRONIC COMPONENT MODULE AND MANUFACTURING METHOD THEREOF

(71) Applicant: Murata Manufacturing Co., Ltd., Nagaokakyo (JP)

(72) Inventors: Hiroshi Somada, Nagaokakyo (JP); Takashi Iwamoto, Nagaokakyo (JP); Yoshiharu Suemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 2 days.

(21) Appl. No.: 16/715,845

(22) Filed: Dec. 16, 2019

(65) Prior Publication Data

US 2020/0120794 A1  Apr. 16, 2020

Related U.S. Application Data

(63) Continuation of application No. PCT/JP2018/024313, filed on Jun. 27, 2018.

(30) Foreign Application Priority Data

Jun. 30, 2017 (JP) .............................. JP2017-129931

(51) Int. Cl.
*H05K 1/11* (2006.01)
*H05K 1/18* (2006.01)
(Continued)

(52) U.S. Cl.
CPC .............. *H05K 1/11* (2013.01); *H05K 1/181* (2013.01); *H05K 3/32* (2013.01); *H05K 3/46* (2013.01); *H05K 2201/032* (2013.01)

(58) Field of Classification Search
CPC . H05K 1/11; H05K 1/181; H05K 3/32; H05K 3/46; H05K 2201/032
(Continued)

(56) References Cited

U.S. PATENT DOCUMENTS

2003/0230804 A1  12/2003 Kouno et al.
2006/0087045 A1  4/2006 Yamano et al.
(Continued)

FOREIGN PATENT DOCUMENTS

JP  2004-022699 A  1/2004
JP  2005-310954 A  11/2005
(Continued)

OTHER PUBLICATIONS

Official Communication issued in International Patent Application No. PCT/JP2018/024313, dated Aug. 21, 2018.

*Primary Examiner* — Sherman Ng
(74) *Attorney, Agent, or Firm* — Keating & Bennett, LLP (57) ABSTRACT

An electronic component module includes an electronic component, a resin structure body, a through wiring, a wiring layer, and a close-contact layer. The resin structure body covers at least a portion of the electronic component. The through wiring extends through the resin structure body. The wiring layer electrically connects the electronic component and the through wiring to each other. The close-contact layer is provided between the resin structure body and the through wiring and is in contact with the resin structure body and the through wiring. The close-contact layer includes an inorganic insulation film.

11 Claims, 8 Drawing Sheets

(51) Int. Cl.
*H05K 3/32* (2006.01)
*H05K 3/46* (2006.01)

(58) Field of Classification Search
USPC .................................. 174/251; 361/760, 761
See application file for complete search history.

(56) References Cited

U.S. PATENT DOCUMENTS

| | | | |
|---|---|---|---|
| 2007/0018190 A1* | 1/2007 | Kim | H01L 33/642 |
| | | | 257/99 |
| 2009/0039999 A1* | 2/2009 | Fujii | H01L 23/645 |
| | | | 336/200 |
| 2010/0207218 A1* | 8/2010 | Taguchi | H01L 21/486 |
| | | | 257/415 |
| 2012/0168206 A1* | 7/2012 | Sekine | H01L 21/486 |
| | | | 174/252 |
| 2013/0026632 A1* | 1/2013 | Kikuchi | H01L 23/552 |
| | | | 257/753 |
| 2013/0221356 A1* | 8/2013 | Yamazaki | H01L 27/108 |
| | | | 257/57 |
| 2014/0239492 A1* | 8/2014 | Fujii | H01L 23/49827 |
| | | | 257/737 |
| 2017/0179054 A1 | 6/2017 | Lin et al. | |
| 2017/0317000 A1* | 11/2017 | Nishimura | H01L 23/13 |

FOREIGN PATENT DOCUMENTS

| | | |
|---|---|---|
| JP | 2006-120943 A | 5/2006 |
| JP | 2015-106671 A | 6/2015 |
| JP | 2017-034155 A | 2/2017 |

\* cited by examiner

ELECTRONIC COMPONENT MODULE AND MANUFACTURING METHOD THEREOF

CROSS REFERENCE TO RELATED APPLICATIONS

This application claims the benefit of priority to Japanese Patent Application No. 2017-129931 filed on Jun. 30, 2017 and is a Continuation Application of PCT Application No. PCT/JP2018/024313 filed on Jun. 27, 2018. The entire contents of each application are hereby incorporated herein by reference.

BACKGROUND OF THE INVENTION

1. Field of the Invention

The present invention generally relates to an electronic component module and a manufacturing method thereof and, more specifically, to an electronic component module including an electronic component and a resin structure body, and a manufacturing method thereof.

2. Description of the Related Art

As an electronic component module, a semiconductor package that includes a semiconductor chip (electronic component), an insulation resin layer (resin structure body), a conductive post (through wiring), a connection terminal, a wiring layer, and a surface layer has been known (see, for example, Japanese Unexamined Patent Application Publication No. 2005-310954).

In the semiconductor package described in Japanese Unexamined Patent Application Publication No. 2005-310954, a connection terminal is disposed on an upper surface of a semiconductor chip, and the entirety, excluding a bottom surface portion, of the semiconductor chip, the connection terminal on the semiconductor chip, a conductive post, and a wiring layer are covered by an insulation resin layer. The material of the conductive post is, for example, Cu.

In the electronic component module described in Japanese Unexamined Patent Application Publication No. 2005-310954, as described above, a through wiring is covered by a resin structure body.

In general, however, adhesion between resin and metal is low, and thus, in the existing electronic component module described in Japanese Unexamined Patent Application Publication No. 2005-310954, adhesion between the through wiring and the resin structure body is low, resulting in a possibility of the through wiring easily detaching from the resin structure body.

SUMMARY OF THE INVENTION

Preferred embodiments of the present provide electronic component modules that each enable a through wiring not to be easily detached, and manufacturing methods thereof.

An electronic component module according to a preferred embodiment of the present invention includes an electronic component, a resin structure body, a through wiring, a wiring layer, and a close-contact layer. The resin structure body covers at least a portion of the electronic component. The through wiring extends through the resin structure body. The wiring layer electrically connects the electronic component and the through wiring to each other. The close-contact layer is provided at least between the resin structure body and the through wiring and is in contact with the resin structure body and the through wiring. The close-contact layer includes an inorganic insulation film.

A method of manufacturing an electronic component module according to a preferred embodiment of the present invention includes a step of preparing a multilayer body and a step of forming, on the multilayer body, a conductor pillar, which is an element of a through wiring. The method of manufacturing the electronic component module further includes a step of fixing an electronic component on the multilayer body on which the conductor pillar is formed and a step of forming, on the multilayer body, a resin structure layer, which is an element of a resin structure body. The method of manufacturing the electronic component module further includes a step of grinding the resin structure layer until a thickness thereof becomes equal or substantially equal to a thickness of the resin structure body, thus forming a structure body including the electronic component, the resin structure body, the through wiring, and the multilayer body, and a step of removing the multilayer body from the structure body. The method of manufacturing the electronic component module further includes a step of forming a wiring layer that electrically connects the electronic component and the through wiring to each other.

The electronic component modules and the manufacturing methods thereof according to preferred embodiments of the present invention enable the through wiring not to be easily detached.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electronic component modules according to preferred embodiments of the present invention will be described in detail with reference to the drawings.

In the electronic component modules according to the preferred embodiments, a close-contact layer that includes an inorganic insulation film is disposed in contact with a resin structure body and a through wiring.

Each of FIG. 1, FIG. 2, FIGS. 3A to 3F, FIGS. 4A to 4E, FIG. 5, FIGS. 6A to 6F, and FIGS. 7A to 7E referred in the following preferred embodiments and the like is a schematic view, and a ratio of each of sizes and thicknesses of elements in the drawings does not necessarily reflect the actual dimension ratio.

First Preferred Embodiment (1) Overall Configuration of Electronic Component Module Hereinafter, an electronic component module 1 according to a first preferred embodiment of the present invention will be described with reference to the drawings.

Figure 1:
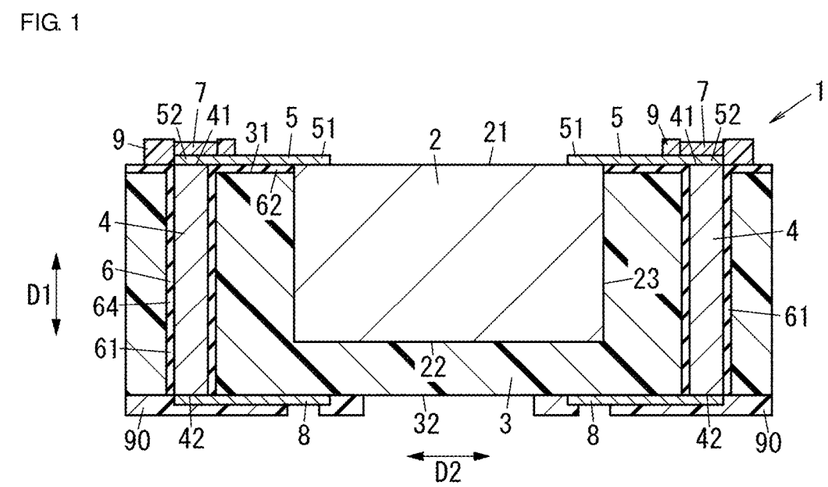
FIG. 1 is a sectional view of an electronic component module according to a first preferred embodiment of the present invention.

As illustrated in FIG. 1, the electronic component module 1 according to the first preferred embodiment includes an electronic component 2, a resin structure body 3, a plurality (two in the illustrated example) of through wirings 4, a plurality (two in the illustrated example) of wiring layers 5, and a close-contact layer 6. In the electronic component module 1, the resin structure body 3 holds the electronic component 2 and the through wirings 4. In the electronic component module 1, the resin structure body 3 protects the electronic component 2 from an impact and the like from outside. The through wirings 4 are at the sides of the electronic component 2 and extend through the resin structure body 3 in a thickness direction (predetermined direction) of the resin structure body 3. The wiring layers 5 electrically connect the electronic component 2 and the through wirings 4 to each other.

In addition, the electronic component module 1 further includes a plurality (two in the illustrated example) of electrodes 7, an external-connection wiring layer 8, and a plurality of resist layers 9 and 90. In the electronic component module 1, the plurality of electrodes 7 are provided as external connection electrodes. The external-connection wiring layer 8 is disposed to electrically connect the through wirings 4 to a circuit board 10 (refer to FIG. 2). The resist layers 9 are provided on the wiring layers 5. The resist layers 90 are provided on the external-connection wiring layer 8.

Figure 2:
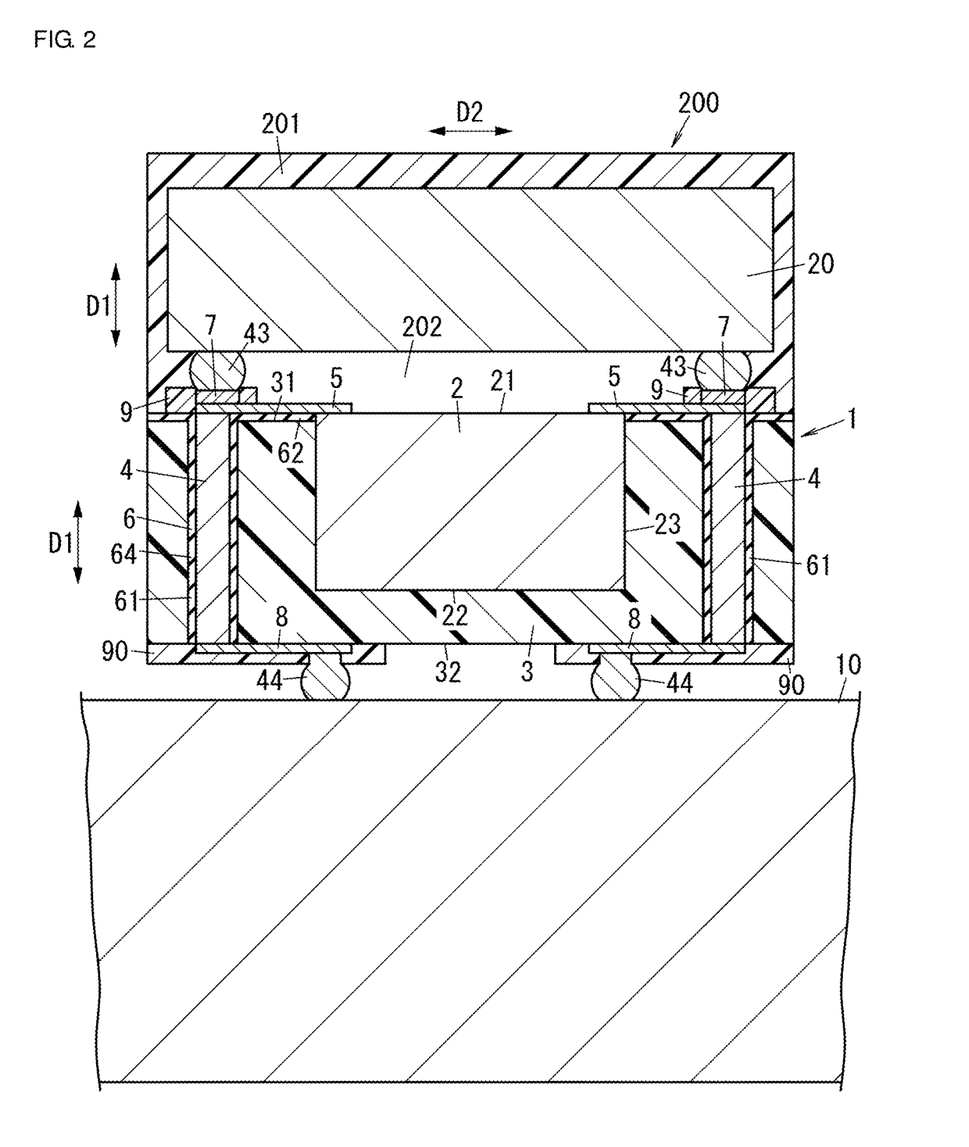
FIG. 2 is a sectional view of a communication module including the electronic module shown in FIG. 1.

The electronic component module 1 may be used as, for example, an interposer (Interposer) interposed between an electronic component 20 (refer to FIG. 2), which is different from the electronic component 2, and the circuit board 10 (refer to FIG. 2). The circuit board 10 is preferably, for example, a printed wiring board.

(2) Elements of Electronic Component Module

Next, elements of the electronic component module 1 will be described with reference to the drawings.

(2.1) Electronic Component

As illustrated in FIG. 1, the electronic component 2 includes a surface 21 and a rear surface 22 opposite to each other in a first direction D1 of the electronic component module 1. More specifically, the electronic component 2 has a plate shape and includes the surface 21 and the rear surface 22 opposite to each other in the thickness direction of the electronic component 2. In addition, the electronic component 2 includes a side surface 23. The shape of the electronic component 2 in plan view (peripheral shape when the electronic component 2 is viewed in the thickness direction thereof) is rectangular or substantially rectangular, but may be, for example, square or substantially square.

The electronic component 2 is preferably, for example, a SAW (Surface Acoustic Wave) filter. The electronic component 2 is, however, not limited to a SAW filter and may be, for example, a BAW (Bulk Acoustic Wave) filter, a RF (Radio Frequency) switch, a thin-film capacitor, or a semiconductor device. The different electronic component 20 described above is preferably, for example, an IC (Integrated Circuit), an inductor, or a SAW filter. In a communication module 200 (refer to FIG. 2) that includes the electronic component module 1, a gap 202 (refer to FIG. 2) is provided between the surface 21 of the electronic component 2, which is a SAW filter, and the different electronic component 20 described above. The electronic component module 1 is electrically connected to the electronic component 20 by a plurality (two in the illustrated example) of conductive bumps 43 and electrically connected to the circuit board 10 by a plurality (two in the illustrated example) of conductive bumps 44.

When the electronic component 2 is a SAW filter, the electronic component 2 includes, for example, a piezoelectric substrate including a surface and a rear surface opposite to each other in the thickness direction, and a functional portion on the surface of the piezoelectric substrate. The piezoelectric substrate is preferably, for example, a LiTaO$_3$ substrate or a LiNbO$_3$ substrate. The thickness of the piezoelectric substrate is preferably, for example, approximately 200 μm. The functional portion includes, for example, one or a plurality of IDT (Interdigital Transducer) electrodes. The functional portion may include a terminal electrode for external connection. The number of terminal electrodes may be one, or two or more. When the electronic component 2 is a SAW filter, the surface 21 of the electronic component 2 includes, for example, an exposed portion of the surface of the piezoelectric substrate and an exposed surface of the functional portion. When the electronic component 2 is a SAW filter, the configuration thereof is not limited to a configuration including a bulk (Bulk) piezoelectric substrate and may be, for example, a configuration including a multilayer structure in which a silicon substrate, a silicon oxide film, and a piezoelectric thin film are laminated on each other in this order, with a functional portion (an IDT electrode, a terminal electrode, and the like) provided on the piezoelectric thin film. The piezoelectric thin film is preferably, for example, a LiTaO$_3$ thin film or a LiNbO$_3$ thin film. The thickness of the piezoelectric thin film is preferably, for example, 3.5λ or less where λ is a wave length of an acoustic wave determined in an electrode finger period of an IDT electrode. The thickness of the piezoelectric thin film is preferably, for example, approximately 0.5 μm. The thickness of the silicon oxide film is preferably, for example, approximately 2.0λ or less. The thickness of the silicon oxide film is preferably, for example, approximately 0.5 μm. The thickness of the multilayer structure is preferably, for example, approximately 200 μm.

(2.2) Resin Structure Body

As illustrated in FIG. 1, the resin structure body 3 holds the electronic component 2. The resin structure body 3 includes a first surface 31 and a second surface 32 opposite to each other in the first direction D1 of the electronic component module 1. More specifically, the resin structure body 3 has a plate shape and includes the first surface 31 and the second surface 32 opposite to each other in the thickness direction of the resin structure body 3. The shape of the resin structure body 3 in plan view (peripheral shape when the resin structure body 3 is viewed in the thickness direction thereof (first direction D1)) is rectangular or substantially rectangular. The shape of the resin structure body 3 in plan view is not limited to rectangular or substantially rectangular and may be, for example, square or substantially square. The flat surface size of the resin structure body 3 is larger than the flat surface size of the electronic component 2.

The resin structure body 3 covers a portion of the side surface 23 and the rear surface 22 of the electronic component 2. In other words, the electronic component 2 is disposed inside the resin structure body 3. The resin structure body 3 holds the electronic component 2 with the surface 21 of the electronic component 2 being exposed.

The resin structure body 3 is made of a resin or the like having electrical insulation properties. In addition to a resin, the resin structure body 3 preferably includes, for example, a filler mixed in the resin. The filler is, however, not always required. The resin is preferably, for example, an epoxy resin or a polyimide resin. Note that the resin is not limited to an epoxy resin or a polyimide resin and may be, for example, an acrylic resin, a urethane resin, a silicon resin, or a fluorine-based resin. The filler is preferably, for example, an inorganic filler of silica, alumina, or the like. The resin structure body 3 may include, for example, a black pigment, such as carbon black or the like, in addition to a resin and a filler.

The resin structure body 3 according to the first preferred embodiment is in contact with the electronic component 2. In other words, the resin structure body 3 holds the electronic component 2 in a state of being in contact with the electronic component 2 without another member interposed between the resin structure body 3 and the electronic component 2.

(2.3) Through Wiring

As illustrated in FIG. 1, in the electronic component module 1, a plurality (two in the illustrated example) of the through wirings 4 are disposed at the sides of the electronic component 2 in the resin structure body 3. In a second direction D2 orthogonal or substantially orthogonal to the first direction D1, the plurality of through wirings 4 are spaced away from the electronic component 2. The plurality of through wirings 4 are held by the resin structure body 3.

The through wirings 4 each have a columnar shape (for example, circular or substantially circular column shape) and each include a first end surface 41 and a second end surface 42 opposite to each other in a direction parallel or substantially parallel to the thickness direction of the resin structure body 3. The through wirings 4 each include the first end surface 41 and the second end surface 42 opposite to each other in the first direction D1. Second ends 52, which will be described later, of the wiring layers 5 are laminated on the first end surfaces 41 of the through wirings 4. Consequently, in the electronic component module 1, the through wirings 4 and the wiring layers 5 are electrically connected to each other.

In the electronic component module 1, the through wirings 4 are electrically connected to the electronic component with the wiring layers 5 interposed therebetween. In the electronic component module 1, the position and the number of the through wirings 4 are not particularly limited.

The material of the through wirings 4 is preferably, for example, a metal or an alloy. In the electronic component module 1 according to the first preferred embodiment, the material of the through wirings 4 is preferably, for example, Cu. The material of the through wirings 4 is not limited to Cu and may be, for example, Ni. The through wirings 4 are preferably formed by, for example, electroplating.

(2.4) Wiring Layer

The wiring layers 5 electrically connect the electronic component 2 and the through wirings 4 to each other on the side of the first surface 31 of the resin structure body 3 and the side of the surface 21 of the electronic component 2. The wiring layers each include a first end 51 connected to the surface 21 (a surface of a terminal portion of the surface 21) of the electronic component 2, and the second end 52 connected to the through wirings 4. The wiring layers 5 extend over the surface 21 of the electronic component 2, the first end surfaces 41 of the through wirings 4, and a second close-contact portion 62, which will be described later, of the close-contact layer 6. The thickness of the wiring layers 5 is preferably, for example, 5 μm or more and 10 μm or less.

The material of the wiring layers 5 is preferably, for example, a metal or an alloy. In the electronic component module 1 according to the first preferred embodiment, one example of the material of the wiring layers 5 is Cu. The wiring layers 5 are preferably Cu layers. The structure of the wiring layers 5 is not limited to a single-layer structure and may be a multilayer structure defined by a plurality of laminated layers. The wiring layers 5 are preferably formed by, for example, sputtering or plating. The method of forming the wiring layers 5 is not limited to sputtering or plating and may be other formation methods.

In addition to the wiring layers 5, the electronic component module 1 further includes the external-connection wiring layer 8 to electrically connect the through wirings 4 to the circuit board 10 (refer to FIG. 2). The external-connection wiring layer 8 is provided on the side of the second surface 32 of the resin structure body 3 so as to extend over the second surface 32 of the resin structure body 3 and the second end surfaces 42 of the through wirings 4. The thickness of the external-connection wiring layer 8 is preferably, for example, about 5 μm or more and about 10 μm or less.

The material of the external-connection wiring layer 8 is preferably, for example, a metal or an alloy. In the electronic component module 1 according to the first preferred embodiment, the material of the external-connection wiring layer 8 is preferably Cu, for example, as is the wiring layers 5. As with the wiring layers 5, the structure of the external-connection wiring layer 8 is not limited to a single-layer structure and may be a multilayer structure including a plurality of laminated layers. The external-connection wiring layer 8 is preferably formed by, for example, sputtering or plating. The method of forming the external-connection wiring layer 8 is not limited to sputtering or plating and may be other formation methods.

The electronic component module 1 further includes the resist layers 90 provided on the external-connection wiring layer 8. The resist layers 90 are made of a material that has lower wettability than the external-connection wiring layer 8. The resist layers 90 are preferably, for example, polyimide layers. Consequently, in the electronic component module 1, it is possible to reduce or prevent solder from spreading out on the external-connection wiring layer 8 during joining of the external-connection wiring layer 8 to the circuit board 10 and the like by soldering.

(2.5) Close-Contact Layer

The close-contact layer 6 includes a plurality of first close-contact portions 61 and the second close-contact portion 62. The first close-contact portions 61 are disposed in contact with the resin structure body 3 and the through wirings 4. The first close-contact portions 61 covers the entire or substantially the entire circumferences, excluding the first end surfaces 41 and the second end surfaces 42, of the circular or substantially circular column-shaped through wirings 4. The second close-contact portion 62 is disposed along the first surface 31 of the resin structure body 3 so as to be in contact with the resin structure body 3 and the wiring layers 5. The plurality of first close-contact portions 61 and the second close-contact portion 62 are integral with each other.

The close-contact layer 6 of the first preferred embodiment is defined by an inorganic insulation film 64. The inorganic insulation film 64 is made of an inorganic insulation material. The inorganic insulation material used in the inorganic insulation film 64 may preferably be, for example, a metal oxide or a metal nitride each having electrical insulation properties and may be a silicon oxide or a silicon nitride. The inorganic insulation film 64 is preferably, for example, a thin-film insulation layer that is thinner than the width of the through wirings 4 in the second direction D2. The film thickness of the thin-film insulation layer is preferably, for example, about 0.01 µm or more and about 2 µm or less.

The resin structure body 3 is provided with such a close-contact layer 6 described above with, of the second surface 32 of the resin structure body 3, a portion of a section overlapping the rear surface 22 in plan view in the first direction D1 being exposed by not being covered by the close-contact layer 6.

(2.6) Electrode

The electronic component module 1 further includes a plurality (two in the illustrated example) of the external-connection electrodes 7 provided on the second ends 52 of the wiring layers 5. In addition, the electronic component module 1 further includes the resist layers 9 provided on the wiring layers 5. The resist layers 9 are made of a material having lower wettability than the electrodes 7 and the wiring layers 5. The resist layers 9 are preferably, for example, polyimide layers. Consequently, in the electronic component module 1, it is possible to reduce spreading out of solder on the wiring layers 5 during joining of the electrodes 7 by soldering to the different electronic component 20 and the like. In other words, it is possible to reduce or prevent solder from spreading out on the wiring layers 5.

The electrodes 7 are preferably, for example, multilayer films including a Ti film on the second ends 52 of the wiring layers 5 and a Au film on the Ti film. The multilayer structure of the electrodes 7 is merely an example and is not limited to this one example.

(3) Method of Manufacturing Electronic Component Module

Next, a non-limiting example of a method of manufacturing the electronic component module 1 according to the first preferred embodiment will be described with reference to FIGS. 3A to 3F and FIGS. 4A to 4E.

In the method of manufacturing the electronic component module 1, a first step to a tenth step are sequentially performed after the electronic component 2 is prepared.

Figure 3A:
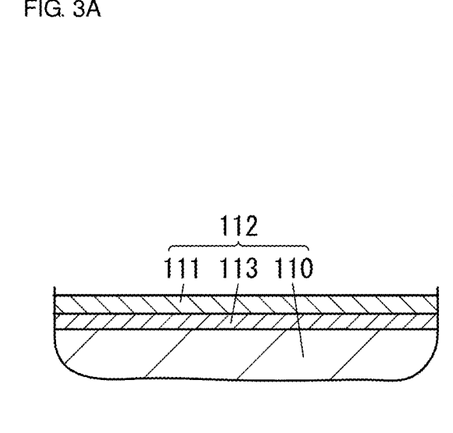
FIGS. 3A to 3F are sectional views for describing a method of manufacturing the electronic component module shown in FIG. 1.

In the first step, as illustrated in FIG. 3A, a multilayer body 112 is prepared. The multilayer body 112 includes a flat plate-shaped support body 110 and a conductive layer 111 adhered to one surface of the support body 110 in the thickness direction by an adhesive layer 113.

Figure 3B:
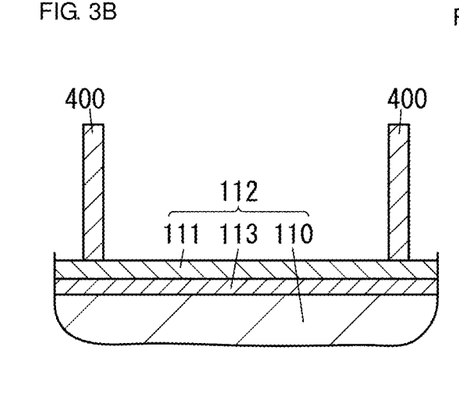

In the second step, as illustrated in FIG. 3B, a plurality of conductor pillars 400, which define and function as elements of the plurality of the through wirings 4, are formed on the conductive layer 111 of the multilayer body 112. In this step, first, a positive photoresist layer that covers the conductive layer 111 is formed. Thereafter, a portion in a location where the through wirings 4 are planned to be formed in the photoresist layer is removed (an opening is formed in the location where the through wirings 4 are planned to be formed) by using a photolithography technology, thus exposing a portion of the conductive layer 111, the portion defining and functioning as a ground of the through wirings 4. Thereafter, the conductor pillars 400 are formed by electroplating. To form the conductor pillars 400, a current is caused to flow between an anode disposed to face a surface of the photoresist layer with a plating solution including copper sulfate interposed therebetween and a cathode defined by the conductive layer 111, thus causing the conductor pillars 400 to precipitate from an exposed surface of the conductive layer 111 in the thickness direction of the photoresist layer. Thereafter, the photoresist layer is removed.

Figure 3C:
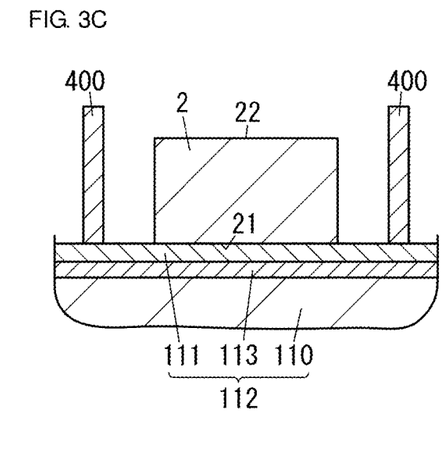

In the third step, as illustrated in FIG. 3C, the electronic component 2 is temporarily fixed on the conductive layer 111 of the multilayer body 112 on which the conductor pillars 400 are formed. More specifically, first, a resin adhesive layer (not illustrated) in a liquid state (paste state) is formed on the conductive layer 111. Next, with the surface 21 of the electronic component 2 facing the resin adhesive layer, the electronic component 2 is pushed against the resin adhesive layer. Consequently, in the third step, the electronic component 2 is temporarily fixed on the conductive layer 111 with the resin adhesive layer interposed therebetween. The resin adhesive layer is preferably formed of a positive resist having photosensitivity.

Note that, if the resin adhesive layer is applied by spin coating or spray coating to form the liquid-state (paste-state) resin adhesive layer (not illustrated) on the conductive layer 111, the resin adhesive layer is formed into a fillet shape around the conductor pillars 400, which reduces a flat region of the resin adhesive layer required to fix the electronic component 2. Thus, there occurs a problem of large electronic components larger than the flat region of the resin adhesive layer being unusable or an interval between the conductor pillars 400 being required to be widened.

Therefore, the resin adhesive layer is formed, on an easily deformable base sheet, into a sheet shape by spray coating, spin coating, pressing, or the like, and the resin adhesive layer is placed to face the conductive layer 111 and caused to adhere thereto by being pushed thereagainst from the side of a base layer by a press or a roller. Thereafter, the base layer is removed, and the resin adhesive layer is transferred onto the conductive layer 111, thus enabling the resin adhesive layer to be formed flat around the conductor pillars 400.

Examples of the material of the easily deformable base sheet include a silicon rubber, a gel, thermoplastic resins (PE, PP, PVC, PS, PVAc, PUR, EVA, and PMMA), a clay, and the like.

Figure 3D:
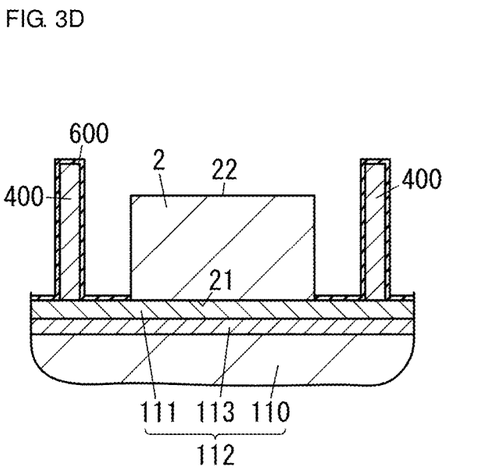

In the fourth step, as illustrated in FIG. 3D, an inorganic insulation layer 600, which is an element of the close-contact layer 6 (inorganic insulation film 64), is formed. In other words, the inorganic insulation layer 600 is formed on exposed surfaces of the conductive layer 111 and the conductor pillars 400. An inorganic insulation material is used in the inorganic insulation layer 600. The inorganic insulation material used in the inorganic insulation layer 600 may be, for example, a metal oxide or a metal nitride each having electrical insulation properties and may be a silicon oxide or a silicon nitride. The inorganic insulation layer 600 is formed on the conductive layer 111 and the conductor pillars 400 by, for example, CVD (Chemical Vapor Deposition), a lithography technology, and an etching technology.

In the fourth step, the inorganic insulation layer, which is an element of the first close-contact portions 61, and the inorganic insulation layer, which is an element of the second close-contact portion 62, are formed substantially simultaneously in a single step with one inorganic insulation layer 600 by using the same materials as each other. Consequently, the first close-contact portions 61 and the second close-contact portion 62 can be integrally formed.

Figure 3E:
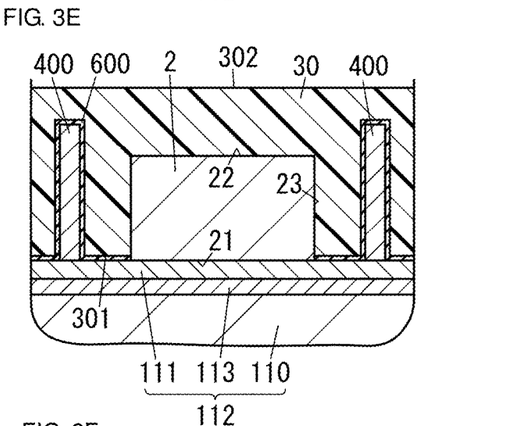

In the fifth step, as illustrated in FIG. 3E, a resin structure layer 30, which is an element of the resin structure body 3, is formed on the multilayer body 112. The resin structure layer 30 is formed on the multilayer body 112 so as to cover the electronic component 2 and the inorganic insulation layer 600 that covers the conductor pillars 400 and the conductive layer 111. In the fifth step, the resin structure layer 30 is formed on the conductive layer 111 of the multilayer body 112 with the inorganic insulation layer 600 interposed therebetween. Here, the resin structure layer 30 includes a first surface 301 and a second surface 302 opposite to each other in the thickness direction thereof. The first surface 301 of the resin structure layer 30 is a surface in contact with the inorganic insulation layer 600. The resin structure layer 30 covers the rear surface 22 and the side surface 23 of the electronic component 2. In addition, the resin structure layer 30 covers side surfaces and top surfaces of the conductor pillars 400 with the inorganic insulation layer 600 interposed therebetween. Thus, the resin structure layer 30 is thicker than the resin structure body 3, and a portion of the resin structure layer 30 and a portion of the inorganic insulation layer 600 are interposed between the second surface 302 of the resin structure layer 30 and the top surfaces of the conductor pillars 400.

In the fifth step, the resin structure layer 30 is formed by a press molding method. Note that the method of forming the resin structure layer 30 is not limited to the press molding method. In the fifth step, for example, the resin structure layer 30 may be formed by applying a material of the resin structure layer 30 on the multilayer body 112 so as to cover the electronic component 2 and the conductor pillars 400, by using a spin coating method and a transfer molding method, and then hardening the material with heat or ultraviolet light.

Figure 3F:
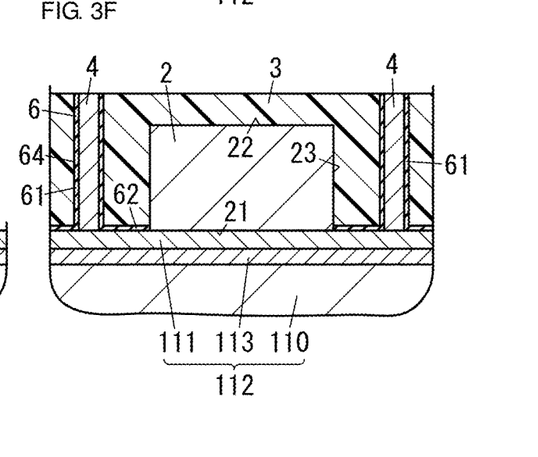

In the sixth step, as illustrated in FIG. 3F, the resin structure layer 30 is ground from the side of the second surface 302, opposite to the first surface 301, until the thickness of the resin structure layer 30 becomes equal or substantially equal to the thickness of the resin structure body 3, thus forming the resin structure body 3. In the sixth step, the resin structure layer 30 is ground such the top surfaces of the conductor pillars 400 are exposed and such that the second surface 302 of the resin structure layer 30 is flush or substantially flush with the top surfaces of the conductor pillars 400. In the sixth step, exposing the top surfaces of the conductor pillars 400 is preferable, and it is not necessary to cause the top surfaces of the conductor pillars 400 and the second surface 302 of the resin structure layer 30 to be flush or substantially flush with each other. Through the sixth step, the resin structure body 3, the through wirings 4, and the close-contact layer 6 are formed.

Figure 4A:
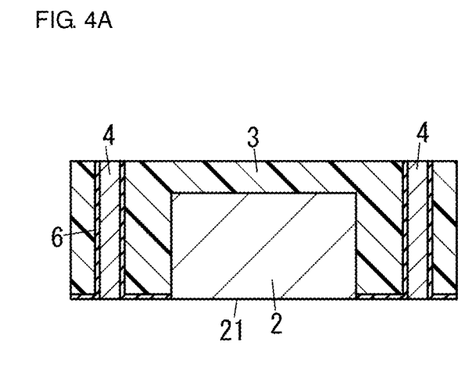
FIGS. 4A to 4E are sectional views for describing the method of manufacturing the electronic component module shown in FIG. 1.

In the seventh step, as illustrated in FIG. 4A, the multilayer body 112 and the resin adhesive layer are removed from a structure body that includes the electronic component 2, the resin structure body 3, the through wirings 4, the close-contact layer 6, the multilayer body 112, and the resin adhesive layer (not illustrated). Consequently, in the seventh step, the surface 21 of the electronic component 2, both end surfaces (the first end surfaces 41 and the second end surfaces 42) of the through wirings 4, and a portion of the close-contact layer 6 can be exposed. In the seventh step, for example, the adhesive force of the adhesive layer 113 with which the conductive layer 111 and the support body 110 are adhered together is reduced to thus remove (peel off) the support body 110 of the multilayer body 112. The adhesive layer 113 is preferably formed of, for example, an adhesive whose adhesive force can be reduced by either of ultraviolet light, infrared light, and heat. The conductive layer 111 of the multilayer body 112 can be removed by, for example, wet etching. In the seventh step, the resin adhesive layer can be removed by developing the resin adhesive layer after exposing the resin adhesive layer to light.

Figure 4B:
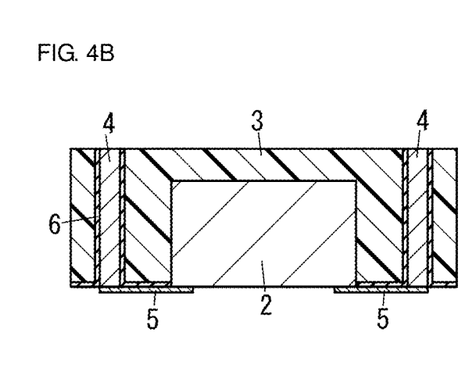

In the eighth step, as illustrated in FIG. 4B, a plurality of the wiring layers 5 that electrically connect the electronic component 2 and the through wirings 4 to each other are formed. In the eighth step, the wiring layers 5 are formed by using, for example, sputtering or plating, a photolithography technology, and an etching technology.

Figure 4C:
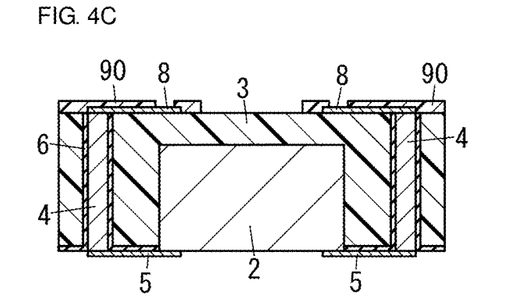

In the ninth step, as illustrated in FIG. 4C, a plurality of the external-connection wiring layers 8 are formed, and thereafter, the resist layers 90 are formed. In the ninth step, for example, sputtering or plating, a photolithography technology, and an etching technology may used to form the external-connection wiring layers 8. In addition, in the ninth step, for example, a coating technology, such as spin coating, and a photolithography technology are used to form the resist layers 90.

Figure 4D:
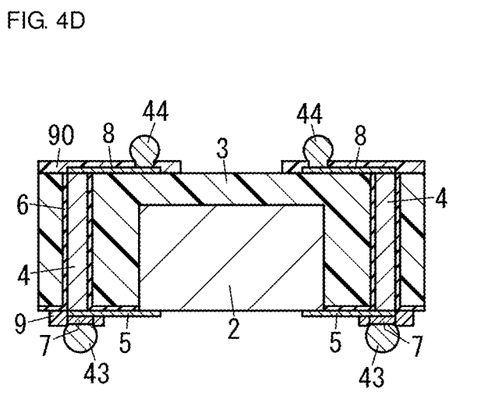

In the tenth step, as illustrated in FIG. 4D, a plurality of the electrodes 7 are formed, and thereafter, the resist layers 9 are formed. More specifically, in the tenth step, for example, a thin-film formation technology, such as sputtering, a photolithography technology, and an etching technology may be used to form the electrodes 7. Thereafter, in the tenth step, for example, a coating technology, such as spin coating, and a photolithography technology may be used to form the resist layers 9. Thereafter, in the tenth step, the conductive bumps 43 and 44 are formed. The conductive bumps 43 and 44 are preferably, for example, solder bumps but are not limited to solder bumps and may be gold bumps, for example.

In the first step, when using, as the multilayer body 112, the multilayer body 112 that has a size with which an aggregate of a plurality of the electronic component modules 1 can be formed, it is possible to form an aggregate of a plurality of the electronic component modules 1 through the first step to the tenth step. In this case, a plurality of the electronic component modules 1 can be obtained by, for example, cutting and separating the aggregate of the plurality of electronic component modules 1 with a dicing machine into individual electronic component modules 1.

In the manufacture of the communication module 200 including the electronic component module 1, a plurality of the communication modules 200 may be obtained by performing the following eleventh step after the tenth step and then performing separation into individual communication modules 200.

Figure 4E:
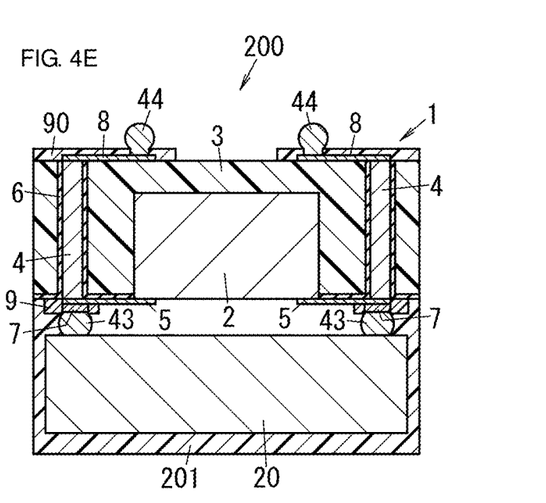

In the eleventh step, as illustrated in FIG. 4E, for example, the electronic component 20, which is different from the electronic component 2 of the electronic component module 1, is mounted on the electronic component module 1. More specifically, in the eleventh step, a terminal electrode of the electronic component 20 and the electrodes 7 of the electronic component module 1 are electrically and mechanically connected to each other with the conductive bumps 43 interposed therebetween. Thereafter, a cover layer 201 that covers the electronic component 20 is formed. As the material of the cover layer 201, for example, a polyimide resin, a benzocyclobutene, polybenzoxazole, or phenol resin, or a silicon resin may be used. The cover layer 201 defines and functions as a sealing layer that seals the electronic component 20 on the electronic component module 1.

(4) Advantageous Effects

In the electronic component module 1 according to the first preferred embodiment, the close-contact layer 6 is provided between the resin structure body 3 and the through wirings 4 and is in contact with the resin structure body 3 and the through wirings 4. In addition, the close-contact layer 6 includes the inorganic insulation film 64. The inorganic insulation film 64 is excellent in both adhesion to resin and adhesion to metal. Thus, in the electronic component module 1 according to the first preferred embodiment, the close-contact layer 6 causes the resin structure body 3 and the through wirings 4 to be in close contact with each other, which enables the through wirings 4 not to be easily detached.

In addition, in the electronic component module 1 according to the first preferred embodiment, the through wirings 4 are covered by the inorganic insulation film 64, and it is thus possible to reduce water (moisture) and the like that enter the through wirings 4 via the resin structure body 3. Consequently, the through wirings 4 can be reduced or prevented from deteriorating, and it is possible to obtain favorable moisture resistance.

In the electronic component module 1 according to the first preferred embodiment, the close-contact layer 6 is disposed not only between the resin structure body 3 and the through wirings 4 but also so as to be in contact with the resin structure body 3 and the wiring layers 5. Due to the inorganic insulation film 64 being excellent in both adhesion to resin and adhesion to metal, it is possible in the electronic component module 1 according to the first preferred embodiment to cause the wiring layers 5 not to be easily detach.

In the electronic component module 1 according to the first preferred embodiment, the first close-contact portions 61 and the second close-contact portion 62 are integral with each other. In other words, the inorganic insulation layer, which is an element of the first close-contact portions 61, and the inorganic insulation layer, which is an element of the second close-contact portion 62, are formed by one inorganic insulation layer 600 substantially simultaneously in a single step by using materials identical to each other. Consequently, differently from the case in which the first close-contact portions and the second close-contact portion are individually formed, it is possible to reduce or prevent infiltration of water (moisture) from an interface because no interface is generated between the first close-contact portions 61 and the second close-contact portion 62. As a result, reliability of the electronic component module 1 can be improved.

In the electronic component module 1 according to the first preferred embodiment, the advantageous effects exerted by the close-contact layer 6 are outstanding because, in particular, Cu has low adhesion to resin.

(5) Modification

In the electronic component module 1 according to the first preferred embodiment, the second surface 32 of the resin structure body 3 is planar, and the shortest distance between the second surface 32 of the resin structure body 3 and the surface 21 of the electronic component 2 is longer than the shortest distance between the second surface 32 and the first surface 31. Consequently, the low profile of the electronic component module 1 according to the first preferred embodiment can be achieved.

In contrast, as a modification of the first preferred embodiment, the second surface 32 of the resin structure body 3 may be planar, and a distance between the second surface 32 of the resin structure body 3 and the surface 21 of the electronic component 2 may be shorter than a distance between the second surface 32 of the resin structure body 3 and the first surface 31 of the resin structure body 3. Consequently, the surface 21 of the electronic component 2 is not easily damaged in the electronic component module 1 according to the present modification.

In addition, as another modification of the first preferred embodiment, the second surface 32 of the resin structure body 3 may be planar, and a distance between the second surface 32 of the resin structure body 3 and the surface 21 of the electronic component 2 may be the same or substantially the same as a distance between the second surface 32 of the resin structure body 3 and the first surface 31 of the resin structure body 3.

The resin structure body 3 covers at least a portion of the side surface 23 of the electronic component 2. The expression "covers at least a portion of the side surface 23 of the electronic component 2" means that, regarding the side surface 23 of the electronic component 2, the entire or substantially the entire circumference of the side surface 23 is covered at least from a location in the side surface 23 of the electronic component 2 displaced from a first end on the side of the surface 21 toward a second end on the side of the rear surface 22 to the boundary between the side surface 23 and the rear surface 22, and includes the case in which the entirety or substantially the entirety of the side surface 23 of the electronic component 2 is covered.

In the example in FIG. 1, the electronic component module 1 includes, with respect to one electronic component 2, two wiring layers 5 directly connected to the electronic component 2. The number of the wiring layers 5 is, however, not limited to two. The number of the wiring layers 5 may be one or three or more.

In the example in FIG. 1, the electronic component module includes one electronic component 2. The number of the electronic components 2 is, however, not limited to one and may be two or more. In this case, the plurality of electronic components may be electronic components of the same type and may be electronic components of different types, or, of the plurality of electronic components 2, only some of the electronic components 2 may be electronic components that are the same or substantially the same as each other. In addition, when the electronic component module 1 includes a plurality of the electronic components 2, the layout of the through wirings 4 and the wiring layers 5 may differ for each electronic component 2.

In the electronic component module 1, the close-contact layer 6 may include one first close-contact portion 61 instead of a plurality of the first close-contact portions 61. In this case, the electronic component module 1 includes one through wiring instead of a plurality of the through wirings 4.

The electronic component module 1 according to each of the aforementioned modifications also provides the same or substantially the same advantageous effects as with the electronic component module 1 according to the first preferred embodiment.

Second Preferred Embodiment

Figure 5:
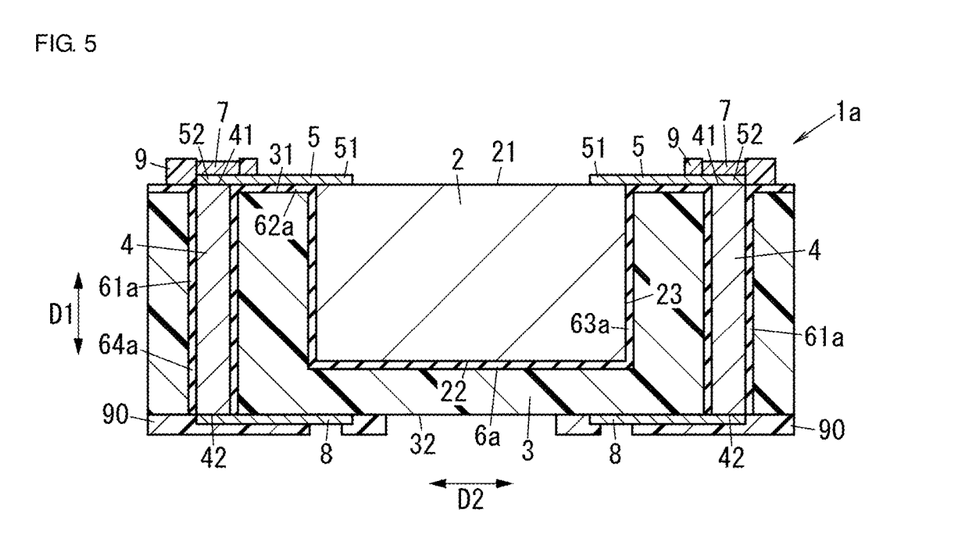
FIG. 5 is a sectional view of an electronic component module according to a second preferred embodiment of the present invention.

An electronic component module 1a according to a second preferred embodiment of the present invention differs from the electronic component module 1 (refer to FIG. 1)

according to the first preferred embodiment in that, as illustrated in FIG. 5, a close-contact layer 6a is disposed not only between the resin structure body 3 and the through wirings 4 but also so as to be in contact with the resin structure body 3 and the electronic component 2. Note that elements the same as or similar to those of the electronic component module 1 according to the first preferred embodiment are denoted by the same signs, and description thereof is omitted.

The electronic component module 1a according to the second preferred embodiment includes, as an alternative to the close-contact layer 6 (refer to FIG. 1) of the first preferred embodiment, the close-contact layer 6a, such as that illustrated in FIG. 5.

The close-contact layer 6a includes a plurality of first close-contact portions 61a, a second close-contact portion 62a, and a third close-contact portion 63a. The first close-contact portions 61a are disposed in contact with the resin structure body and the through wirings 4, as with the first close-contact portions 61 (refer to FIG. 1) of the first preferred embodiment. The third close-contact portion 63a is disposed in contact with the resin structure body 3 and the electronic component 2. More specifically, the third close-contact portion 63a covers the rear surface 22 and the side surface 23 of the electronic component 2. Each second close-contact portion 62a is disposed between the resin structure body 3 and the wiring layers 5 so as to extend along the first surface 31 of the resin structure body 3, as with the second close-contact portion 62 (refer to FIG. 1) of the first preferred embodiment. Note that a description of functions that are the same as or similar to those of the close-contact layer 6 (refer to FIG. 1) of the first preferred embodiment is omitted.

The close-contact layer 6a of the second preferred embodiment is defined by, as with the close-contact layer 6 of the first preferred embodiment, an inorganic insulation film 64a that has electrical insulation properties. The inorganic insulation film 64a is made of an inorganic insulation material. The inorganic insulation material used in the inorganic insulation film 64a is preferably, for example, a metal oxide, a metal nitride, a silicon oxide, or silicon nitride each having electrical insulation properties. The inorganic insulation film 64a is preferably, for example, a thin-film insulation layer that is thinner than the width of the through wirings 4 in the second direction D2.

Next, a non-limiting example of a method of manufacturing the electronic component module 1a according to the second preferred embodiment will be described with reference to FIGS. 6A to 6F and FIGS. 7A to 7E.

In the method of manufacturing the electronic component module 1a, a first step to a tenth step are sequentially performed after the electronic component 2 is prepared.

Figure 6A:
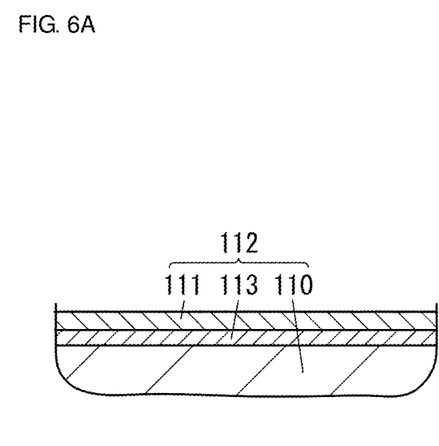
FIGS. 6A to 6F are sectional views for describing a method of manufacturing the electronic component module shown in FIG. 5.
Figure 6B:
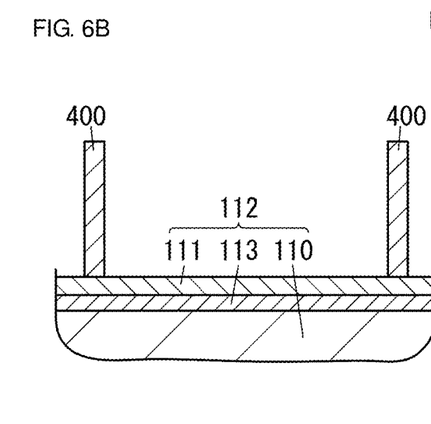
Figure 6C:
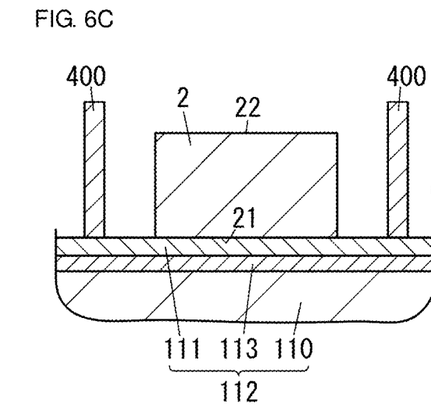

The first step to the third step in the second preferred embodiment are the same or substantially the same as the first step to the third step in the first preferred embodiment. In the first step, as illustrated in FIG. 6A, the multilayer body 112 is prepared. In the second step, as illustrated in FIG. 6B, a plurality of the conductor pillars 400, which define and function as elements of a plurality of the through wirings 4, are formed on the conductive layer 111 of the multilayer body 112. In the third step, as illustrated in FIG. 6C, the electronic component 2 is temporarily fixed on the conductive layer 111 of the multilayer body 112 on which the conductor pillars 400 are formed.

Figure 6D:
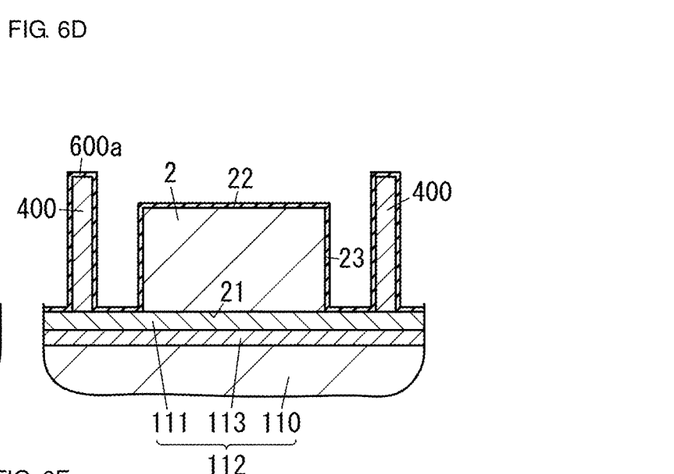

In the fourth step, as illustrated in FIG. 6D, an inorganic insulation layer 600a, which is an element of the close-contact layer 6a (inorganic insulation film 64a) is formed. In the fourth step of the second preferred embodiment, the inorganic insulation layer 600a is formed not only on the exposed surfaces of the conductive layer 111 and the conductor pillars 400 but also on the rear surface 22 and the side surface 23 of the electronic component 2.

Figure 6E:
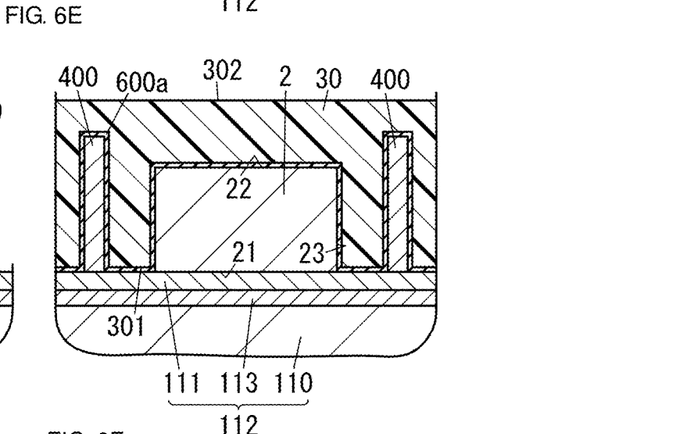

In the fifth step, as illustrated in FIG. 6E, the resin structure layer 30, which is an element of the resin structure body 3, is formed on the multilayer body 112 so as to cover the inorganic insulation layer 600a that covers the electronic component 2, the conductor pillars 400, and the conductive layer 111. In the fifth step, the resin structure layer 30 is formed on the conductive layer 111 of the multilayer body 112 with the inorganic insulation layer 600a interposed therebetween.

In the fifth step, as with in the fifth step of the first preferred embodiment, the resin structure layer 30 is formed by a press molding method. Note that, also in the second preferred embodiment, the method of forming the resin structure layer 30 is not limited to a press molding method.

Figure 6F:
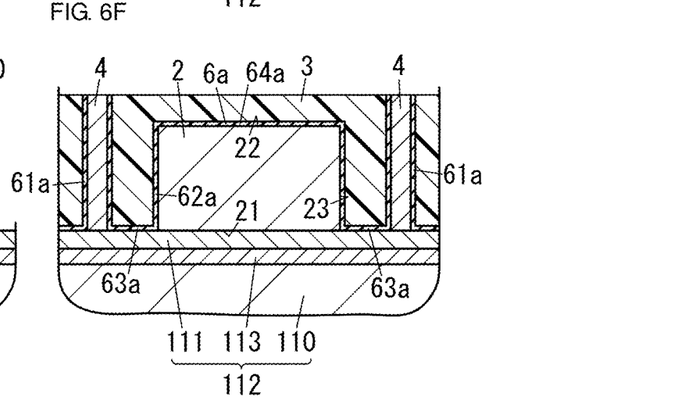

In the sixth step, as illustrated in FIG. 6F, the resin structure layer 30 is ground from the side of the second surface 302 until the thickness of the resin structure layer 30 becomes equal or substantially equal to the thickness of the resin structure body 3, thus forming the resin structure body 3, as with in the sixth step of the first preferred embodiment.

Figure 7A:
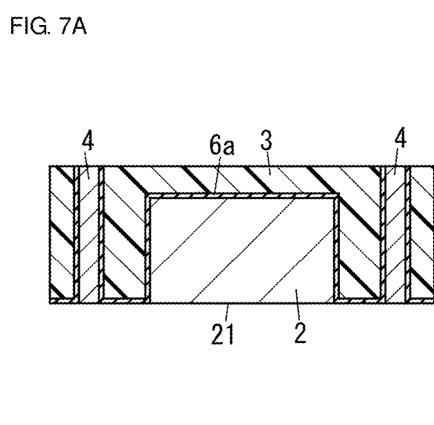
FIGS. 7A to 7E are sectional views for describing the method of manufacturing the electronic component module shown in FIG. 5.
Figure 7B:
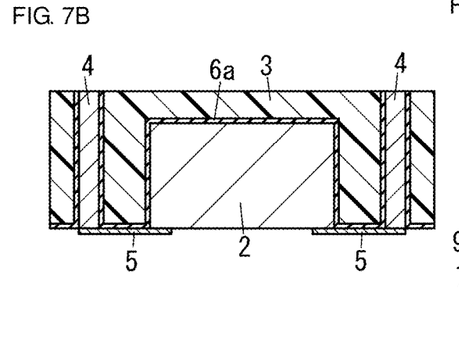
Figure 7C:
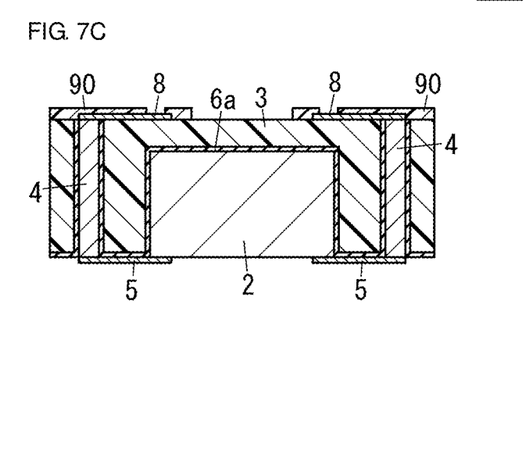
Figure 7D:
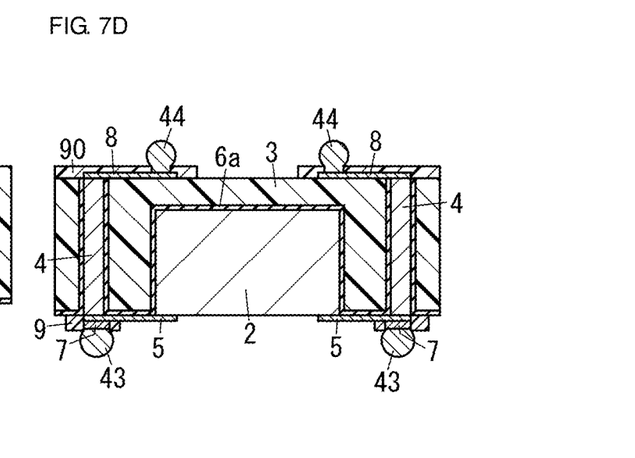

The seventh step to the tenth step in the second preferred embodiment are the same or substantially the same as the seventh step to the tenth step in the first preferred embodiment. In the seventh step, as illustrated in FIG. 7A, the multilayer body 112 and the resin adhesive layer are removed from a structure body that includes the electronic component 2, the resin structure body 3, the through wirings 4, the close-contact layer 6a, the multilayer body 112, and the resin adhesive layer (not illustrated). In the eighth step, as illustrated in FIG. 7B, a plurality of the wiring layers 5 that electrically connect the electronic component 2 and the through wirings 4 to each other are formed. In the ninth step, as illustrated in FIG. 7C, a plurality of the external-connection wiring layers 8 and the resist layers 90 are formed. In the tenth step, as illustrated in FIG. 7D, a plurality of the electrodes 7, the resist layers 9, and a plurality of the conductive bumps 43 and 44 are formed.

Figure 7E:
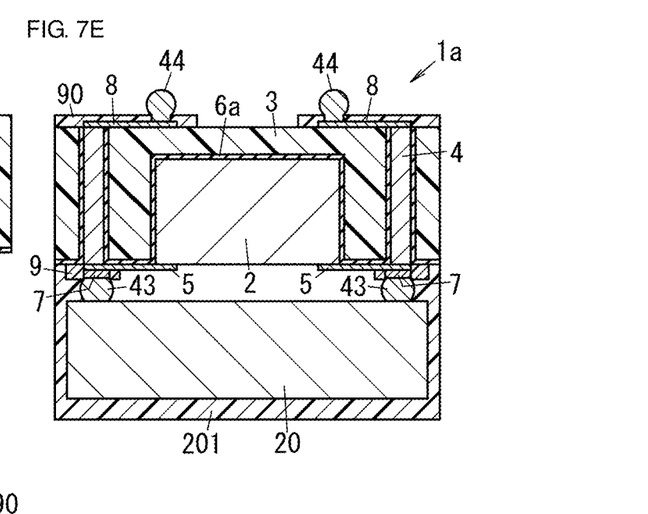

In the eleventh step, as illustrated in FIG. 7E, the electronic component 20 is mounted on the electronic component module 1a, and thereafter, the cover layer 201 that covers the electronic component 20 is formed, as with in the eleventh step of the first preferred embodiment.

As described above, in the electronic component module 1a according to the second preferred embodiment, the close-contact layer 6a is disposed not only between the resin structure body 3 and the through wirings 4 but also so as to be in contact with the resin structure body 3 and the electronic component 2. Consequently, it is possible to cause the electronic component 2 not to be easily detached, even when a main material of the electronic component 2 is a material having low adhesion with respect to resin.

The close-contact layer 6a of the second preferred embodiment is applicable not only to the electronic component module 1 according to the first preferred embodiment but also to the electronic component module 1 according to each of the modifications of the first preferred embodiment.

Third Preferred Embodiment

Figure 8:
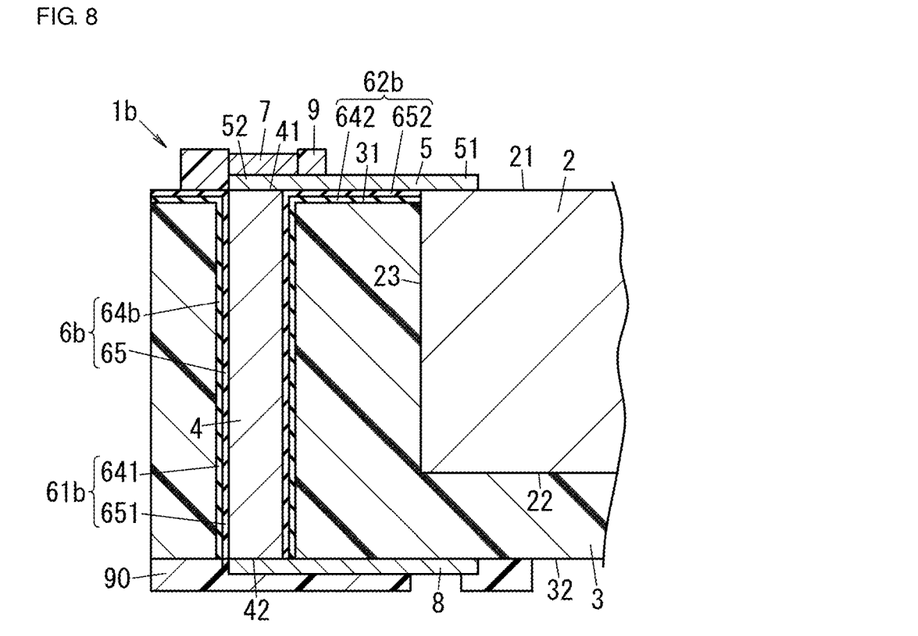
FIG. 8 is a sectional view of a main portion of an electronic component module according to a third preferred embodiment of the present invention.

An electronic component module 1b according to a third preferred embodiment of the present invention differs from the electronic component module 1 (refer to FIG. 1) according to the first preferred embodiment in that a close-contact layer 6*b*, such as that illustrated in FIG. 8, is included. Note that elements the same as or similar to those of the electronic component module 1 according to the first preferred embodiment are denoted by the same signs, and description thereof is omitted.

The electronic component module 1*b* according to the third preferred embodiment includes the close-contact layer 6*b*, such as that illustrated in FIG. 8, as an alternative to the close-contact layer 6 (refer to FIG. 1) of the first preferred embodiment.

The close-contact layer 6*b* includes an inorganic insulation film 64*b* and a diffusion prevention film 65 that reduces diffusion of metal. The inorganic insulation film 64*b* includes a plurality of first insulation portions 641 disposed at the first close-contact portions 61*b* and a second insulation portion 642 disposed at the second close-contact portion 62*b*. Note that description of functions the same as or similar to those of the close-contact layer 6 (refer to FIG. 1) of the first preferred embodiment is omitted.

The diffusion prevention film 65 is made of a material that differs from that of the inorganic insulation film 64, and includes a plurality of first diffusion prevention portions 651 and a plurality of second diffusion prevention portions 652. The first diffusion prevention portions 651 are disposed between the first insulation portions 641 of the inorganic insulation film 64*b* and the through wirings 4. The second diffusion prevention portions 652 are disposed between the second insulation portion 642 of the inorganic insulation film 64*b* and the wiring layers 5.

The diffusion prevention film 65 is preferably made of, for example, at least one of a silicon nitride and a metal oxide. The diffusion prevention film 65 is preferably, for example, a film that is thinner than the width of the through wirings 4 in the second direction D2.

As an example of a combination of the inorganic insulation film 64*a* and the diffusion prevention film 65 in the close-contact layer 6*b* of the third preferred embodiment, a silicon oxide and a silicon nitride are preferably used in the inorganic insulation film 64*a* and the diffusion prevention film 65, respectively. Consequently, it is possible to reduce a possibility of the Cu of the through wirings 4 and the silicon oxide of the inorganic insulation film 64 coming into contact with each other, and it is thus possible to reduce or prevent the Cu from diffusing into the silicon oxide.

In the electronic component module 1*b* according to the third preferred embodiment described above, the diffusion prevention film 65 that reduces diffusion of metal is provided as the close-contact layer 6*b* together with the inorganic insulation film 64*b*. Consequently, it is possible to reduce or prevent the metal of the through wirings 4 from diffusing. As a result, it is possible to reduce or prevent formation of a void.

The diffusion prevention film 65 is not limited to a silicon nitride and may be a metal oxide, such as, for example, a titanium oxide, having electrical insulation properties.

The close-contact layer 6*b* of the third preferred embodiment is applicable not only to the electronic component module 1 according to the first preferred embodiment but also to the electronic component module 1 according to each of the modifications of the first preferred embodiment or to the electronic component module 1*b* according to the second preferred embodiment.

Each of the first to third preferred embodiments described above is merely one of various preferred embodiments of the present invention. The first to third preferred embodiments can be variously changed in accordance with design and the like provided that the advantageous effects of the present invention are achieved.

The preferred embodiments and the like described above include the following elements and features.

An electronic component module (1; 1*a*; 1*b*) according to a preferred embodiment of the present invention includes an electronic component (2), a resin structure body (3), a through wiring (4), a wiring layer (5), and a close-contact layer (6; 6*a*; 6*b*). The resin structure body (3) covers at least a portion of the electronic component (2). The through wiring (4) extends through the resin structure body (3). The wiring layer (5) electrically connects the electronic component (2) and the through wiring (4) to each other. The close-contact layer (6; 6*a*; 6*b*) is provided at least between the resin structure body (3) and the through wiring (4) and is in contact with the resin structure body (3) and the through wiring (4). The close-contact layer (6; 6*a*; 6*b*) includes an inorganic insulation film (64; 64*a*, 64*b*).

In an electronic component module (1; 1*a*; 1*b*) according to a preferred embodiment of the present invention, the close-contact layer (6) is provided between the resin structure body (3) and the through wiring (4) and is in contact with the resin structure body (3) and the through wiring (4). In addition, the close-contact layer (6; 6*a*; 6*b*) includes the inorganic insulation film (64). The inorganic insulation film (64; 64*a*; 64*b*) is excellent in both adhesion to resin and adhesion to metal. Thus, in the electronic component module (1; 1*a*; 1*b*) according to the present preferred embodiment, the close-contact layer (6) has a function of causing the resin structure body (3) and the through wiring (4) to be in close contact with each other, which enables the through wiring (4) not to be easily detached.

In addition, in an electronic component module (1; 1*a*; 1*b*) according to a preferred embodiment of the present invention, the through wiring (4) is covered by the inorganic insulation film (64; 64*a*; 64*b*), and it is thus possible to reduce water (moisture) and the like that enter the through wiring (4) via the resin structure body (3). Consequently, the through wiring (4) can be reduced or prevented from deteriorating, and it is possible to obtain favorable moisture resistance.

In an electronic component module (1; 1*a*; 1*b*) according to a preferred embodiment of the present invention, the close-contact layer (6; 6*a*; 6*b*) includes a first close-contact portion (61; 61*a*; 61*b*) and a second close-contact portion (62; 62*a*; 62*b*). The first close-contact portion (61; 61*a*; 61*b*) is disposed in contact with the resin structure body (3) and the through wiring (4). The second close-contact portion (62; 62*a*; 62*b*) is disposed in contact with the resin structure body (3) and the wiring layer (5).

In an electronic component module (1; 1*a*; 1*b*) according to a preferred embodiment of the present invention, the close-contact layer (6; 6*a*; 6*b*) is disposed not only between the resin structure body (3) and the through wiring (4) but also so as to be in contact with the resin structure body (3) and the wiring layer (5). The inorganic insulation film (64; 64*a*; 64*b*) is excellent in both adhesion to resin and adhesion to metal, and it is thus possible in the electronic component module (1; 1*a*, 1*b*) according to the present preferred to cause the wiring layer (5) not to be easily detached.

In an electronic component module (1; 1*a*; 1*b*) according to a preferred embodiment of the present invention, the first close-contact portion (61; 61*a*; 61*b*) and the second close-contact portion (62; 62*a*; 62*b*) are integral with each other in the second aspect.

In an electronic component module (1; 1a; 1b) according to a preferred embodiment of the present invention, the first close-contact portion (61; 61a; 61b) and the second close-contact portion (62; 62a; 62b) are integral with each other. Consequently, differently from the case in which the first close-contact portion and the second close-contact portion are individually provided, it is possible to reduce or prevent infiltration of water (moisture) from an interface because no interface is generated between the first close-contact portion (61; 61a; 61b) and the second close-contact portion (62; 62a; 62b). As a result, reliability of the electronic component module (1; 1a; 1b) can be improved.

In an electronic component module (1; 1a; 1b) according to a preferred embodiment of the present invention, the first close-contact portion (61; 61a; 61b) and the second close-contact portion (62; 62a; 62b) are made of the same or substantially the same materials as each other.

In an electronic component module (1; 1a; 1b) according to a preferred embodiment of the present invention, the inorganic insulation film (64; 64a; 64b) is a metal oxide or a metal nitride having electrical insulation properties or a silicon oxide or a silicon nitride.

In an electronic component module (1b) according to a preferred embodiment of the present invention, the close-contact layer (6b) further includes a diffusion prevention film (65). The diffusion prevention film (65) is made of a material that differs from that of the inorganic insulation film (64b) and reduces diffusion of metal.

In an electronic component module (1b) according to a preferred embodiment of the present invention, the diffusion prevention film (65) that reduces diffusion of metal is disposed as the close-contact layer (6b) together with the inorganic insulation film (64b). Consequently, it is possible to reduce or prevent the metal of the through wiring (4) from diffusing. As a result, formation of a void can be reduced or prevented.

In an electronic component module (1b) according to a preferred embodiment of the present invention, the diffusion prevention film (65) is made of at least one of a silicon nitride and a metal oxide.

In an electronic component module (1b) according to a preferred embodiment of the present invention, the diffusion prevention film (65) is disposed between the inorganic insulation film (64b) and the through wiring (4).

In an electronic component module (1; 1a; 1b) according to a preferred embodiment of the present invention, the resin structure body (3) is made of an epoxy resin or a polyimide resin.

In an electronic component module (1; 1a; 1b) according to a preferred embodiment of the present invention, the wiring layer (5) is made of a conductor containing Cu.

In an electronic component module (1; 1a; 1b) according to a preferred embodiment of the present invention, the advantageous effects exerted by the close-contact layer are outstanding because, in particular, Cu has low adhesion with respect to resin.

An electronic component module (1; 1a; 1b) according to a preferred embodiment of the present invention further includes an electrode (7) and a resist layer (9). The electrode (7) is provided on the wiring layer (5). The resist layer (9) is provided, on the wiring layer (5), in a location that differs from a location of the electrode (7). The resist layer (9) is made of a material that is lower in wettability than the electrode (7) and the wiring layer (5).

In an electronic component module (1; 1a; 1b) according to a preferred embodiment of the present invention, it is possible to reduce or prevent solder from spreading out on the wiring layer (5) when joining the electrode (7) by soldering to a different electronic component (20) and the like.

An electronic component module (1; 1a; 1b) according to a preferred embodiment of the present invention further includes an external-connection wiring layer (8) and a resist layer (90). The external-connection wiring layer (8) is electrically connected to the through wiring (4). The resist layer (90) is provided on the external-connection wiring layer (8). The resist layer (90) is provided of a material that is lower in wettability than the external-connection wiring layer (8).

In an electronic component module (1; 1a; 1b) according to a preferred embodiment of the present invention, it is possible to reduce or prevent solder from spreading out on the external-connection wiring layer (8) when joining the external-connection wiring layer (8) by soldering to a circuit board (10) and the like.

A method of manufacturing the electronic component module (1; 1a; 1b) according to a preferred embodiment of the present invention includes a step of preparing a multilayer body (112) and a step of forming, on the multilayer body (112), a conductor pillar (400), which is an element of the through wiring (4). The method of manufacturing the electronic component module (1; 1a; 1b) further includes a step of fixing the electronic component (2) on the multilayer body (112) on which the conductor pillar (400) is formed and a step of forming, on the multilayer body (112), a resin structure layer (30), which is an element of the resin structure body (3). The method of manufacturing the electronic component module (1; 1a; 1b) further includes a step of grinding the resin structure layer (30) until a thickness thereof becomes equal or substantially equal to the thickness of the resin structure body (3), thus forming a structure body that includes the electronic component (2), the resin structure body (3), the through wiring (4), and the multilayer body (112), and a step of removing the multilayer body (112) from the structure body. The method of manufacturing the electronic component module (1; 1a; 1b) further includes a step of forming the wiring layer (5) that electrically connects the electronic component (2) and the through wiring (4) to each other.

An electronic component module (1; 1a; 1b) according to a preferred embodiment of the present invention further includes, between the step of fixing the electronic component (2) and the step of forming the resin structure layer (30), a step of forming an inorganic insulation layer (600; 600a), which is an element of the close-contact layer (6; 6a; 6b), on exposed surfaces of the multilayer body (112) and the conductor pillar (400). In the step of forming the aforementioned structure body, the resin structure layer (30) is ground until the thickness thereof becomes equal or substantially equal to the thickness of the resin structure body (3), thus forming the aforementioned structure body that includes the electronic component (2), the resin structure body (3), the through wiring (4), the multilayer body (112), and the inorganic insulation layer (600; 600a).

In an electronic component module (1; 1a; 1b) according to a preferred embodiment of the present invention, the step of forming the electronic component (2) includes a step of forming a liquid-state resin adhesive layer on the multilayer body (112) and a step of pushing the electronic component (2) against the resin adhesive layer with the surface of the electronic component (2) facing the resin adhesive layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising: an electronic component; a resin structure body that covers at least a portion of the electronic component; a through wiring that extends through the resin structure body; a wiring layer that electrically connects the electronic component and the through wiring to each other; and a close-contact layer that is provided at least between the resin structure body and the through wiring and is in contact with the resin structure body and the through wiring; wherein the close-contact layer includes an inorganic insulation film; the close-contact layer further includes a diffusion prevention film that is made of a material differing from a material of the inorganic insulation film and that reduces diffusion of metal; and the diffusion prevention film is disposed between the inorganic insulation film and the through wiring.

2. The electronic component module according to claim 1, wherein the close-contact layer includes: a first close-contact portion in contact with the resin structure body and the through wiring; and a second close-contact portion in contact with the resin structure body and the wiring layer.

3. The electronic component module according to claim 2, wherein the first close-contact portion and the second close-contact portion are integral with each other.

4. The electronic component module according to claim 3, wherein the first close-contact portion and the second close-contact portion are made of a same or substantially a same material as each other.

5. The electronic component module according to claim 1, wherein the inorganic insulation film is made of a metal oxide or a metal nitride having electrical insulation properties, or a silicon oxide or a silicon nitride.

6. The electronic component module according to claim 1, wherein the diffusion prevention film is made of at least one of a silicon nitride and a metal oxide.

7. The electronic component module according to claim 1, wherein the resin structure body is made of an epoxy resin or a polyimide resin.

8. The electronic component module according to claim 1, wherein the wiring layer is made of a conductor including Cu.

9. The electronic component module according to claim 1, wherein the through wiring is made of Cu.

10. The electronic component module according to claim 1, further comprising: an electrode on the wiring layer; and a resist layer on the wiring layer, the resist layer being in a location that differs from a location of the electrode; wherein the resist layer is made of a material having lower wettability than the electrode and the wiring layer.

11. The electronic component module according to claim 1, further comprising: an external-connection wiring layer electrically connected to the through wiring; and a resist layer on the external-connection wiring layer; wherein the resist layer is made of a material having lower wettability than the external-connection wiring layer.

* * * * *